United States Patent
Venkataraman et al.

(10) Patent No.: US 9,157,012 B2
(45) Date of Patent: Oct. 13, 2015

(54) PROCESS FOR THE MANUFACTURE OF SEMICONDUCTOR DEVICES COMPRISING THE CHEMICAL MECHANICAL POLISHING OF BOROPHOSPHOSILICATE GLASS (BPSG) MATERIAL IN THE PRESENCE OF A CMP COMPOSITION COMPRISING ANIONIC PHOSPHATE OR PHOSPHONATE

(75) Inventors: Shyam Sundar Venkataraman, Ludwigshafen (DE); Eason Yu-Shen Su, New Taipei (TW)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/362,439

(22) PCT Filed: Dec. 21, 2011

(86) PCT No.: PCT/IB2011/055862
§ 371 (c)(1),
(2), (4) Date: Jun. 3, 2014

(87) PCT Pub. No.: WO2013/093556
PCT Pub. Date: Jun. 27, 2013

(65) Prior Publication Data
US 2014/0326701 A1  Nov. 6, 2014

(51) Int. Cl.
*C09G 1/02* (2006.01)
*C03C 15/00* (2006.01)
*H01L 21/3105* (2006.01)
*C09K 3/14* (2006.01)

(52) U.S. Cl.
CPC . *C09G 1/02* (2013.01); *C03C 15/00* (2013.01); *C09K 3/1409* (2013.01); *C09K 3/1436* (2013.01); *C09K 3/1463* (2013.01); *H01L 21/31053* (2013.01)

(58) Field of Classification Search
None
See application file for complete search history.

(56) References Cited

U.S. PATENT DOCUMENTS

| | | | | |
|---|---|---|---|---|
| 5,169,491 A * | 12/1992 | Doan | | 438/693 |
| 6,203,407 B1 * | 3/2001 | Robinson | | 451/41 |
| 6,271,123 B1 * | 8/2001 | Jang et al. | | 438/633 |
| 6,399,461 B1 * | 6/2002 | Liu et al. | | 438/436 |
| 6,726,534 B1 * | 4/2004 | Bogush et al. | | 451/36 |
| 7,413,959 B2 | 8/2008 | Lee et al. | | |
| 7,837,800 B2 | 11/2010 | Fukasawa et al. | | |
| 7,838,482 B2 | 11/2010 | Fukasawa et al. | | |
| 8,168,541 B2 | 5/2012 | Fukasawa et al. | | |
| 2002/0151177 A1 * | 10/2002 | Cherian et al. | | 438/691 |
| 2002/0197935 A1 * | 12/2002 | Mueller et al. | | 451/36 |
| 2003/0082998 A1 * | 5/2003 | Carter et al. | | 451/41 |
| 2004/0029375 A1 | 2/2004 | Lee et al. | | |
| 2005/0076581 A1 * | 4/2005 | Small et al. | | 51/307 |
| 2005/0266689 A1 * | 12/2005 | Small et al. | | 438/693 |
| 2006/0148667 A1 | 7/2006 | Fukasawa et al. | | |
| 2006/0175295 A1 * | 8/2006 | Chu et al. | | 216/88 |
| 2006/0205218 A1 * | 9/2006 | Mueller | | 438/692 |
| 2006/0234509 A1 * | 10/2006 | Small et al. | | 438/692 |
| 2007/0077865 A1 * | 4/2007 | Dysard et al. | | 451/41 |
| 2007/0144915 A1 * | 6/2007 | Tian et al. | | 205/640 |
| 2007/0176141 A1 | 8/2007 | Lane et al. | | |
| 2007/0218811 A1 * | 9/2007 | Kurata et al. | | 451/28 |
| 2008/0214093 A1 | 9/2008 | Fukasawa et al. | | |
| 2008/0277767 A1 * | 11/2008 | Lee et al. | | 257/647 |
| 2009/0047786 A1 | 2/2009 | Fukasawa et al. | | |
| 2009/0081927 A1 | 3/2009 | Grumbine et al. | | |
| 2010/0112906 A1 * | 5/2010 | Liu | | 451/41 |
| 2010/0261632 A1 * | 10/2010 | Korzenski et al. | | 510/175 |
| 2011/0028073 A1 | 2/2011 | Fukasawa et al. | | |
| 2011/0165777 A1 * | 7/2011 | Siddiqui et al. | | 438/692 |
| 2012/0299158 A1 * | 11/2012 | Shinoda et al. | | 257/618 |
| 2013/0045598 A1 * | 2/2013 | Guo et al. | | 438/693 |
| 2013/0045599 A1 * | 2/2013 | Ye | | 438/693 |
| 2013/0059439 A1 * | 3/2013 | Shinoda et al. | | 438/693 |
| 2013/0168348 A1 * | 7/2013 | Li et al. | | 216/13 |
| 2013/0200038 A1 * | 8/2013 | Li et al. | | 216/13 |
| 2013/0200039 A1 * | 8/2013 | Noller et al. | | 216/13 |
| 2013/0244433 A1 * | 9/2013 | Reiss et al. | | 438/693 |
| 2013/0248756 A1 * | 9/2013 | Venkataraman et al. | | 252/79.1 |
| 2013/0344696 A1 * | 12/2013 | Li et al. | | 438/693 |

FOREIGN PATENT DOCUMENTS

| | | |
|---|---|---|
| JP | 2006-41033 A | 2/2006 |
| WO | WO 03/008665 A1 | 1/2003 |
| WO | WO 2004/063301 A1 | 7/2004 |
| WO | WO 2011071168 A1 * | 6/2011 |

OTHER PUBLICATIONS

International Search Report issued Oct. 18, 2012 in PCT/IB2011/055862.
M. Kirchhoff, et al., "Application of Borophosphosilicate Glass (BPSG) in Microelectronic Processing" Ber. Bunsenges. Phys. Chem., vol. 100, No. 8, 1996, pp. 1434-1437.

* cited by examiner

*Primary Examiner* — Allan Olsen
(74) *Attorney, Agent, or Firm* — Oblon, McClelland, Maier & Neustadt, L.L.P.

(57) ABSTRACT

Provided is a process for the manufacture of semiconductor devices comprising the chemical mechanical polishing of borophosphosilicate glass (BPSG) material in the presence of a chemical mechanical polishing (CMP) composition which comprises: (A) inorganic particles, organic particles, or a mixture or composite thereof, (B) at least one type of anionic phosphate or phosphonate as dispersing agent or charge reversal agent, (C) at least one type of surfactant, and (D) an aqueous medium.

17 Claims, No Drawings

PROCESS FOR THE MANUFACTURE OF SEMICONDUCTOR DEVICES COMPRISING THE CHEMICAL MECHANICAL POLISHING OF BOROPHOSPHOSILICATE GLASS (BPSG) MATERIAL IN THE PRESENCE OF A CMP COMPOSITION COMPRISING ANIONIC PHOSPHATE OR PHOSPHONATE

This invention essentially relates to a chemical mechanical polishing (CMP) composition and its use in polishing substrates of the semiconductor industry. The process according to the invention comprises the chemical mechanical polishing of borophosphosilicate glass (referred to as "BPSG" in the following) material in the presence of a specific CMP composition.

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. Chemical action is provided by a chemical composition, also referred to as CMP composition or CMP slurry. Mechanical action is usually carried out by a polishing pad which is typically pressed onto the to-be-polished surface and mounted on a moving platen. The movement of the platen is usually linear, rotational or orbital.

In a typical CMP process step, a rotating wafer holder brings the to-be-polished wafer in contact with a polishing pad. The CMP composition is usually applied between the to-be-polished wafer and the polishing pad.

In the state of the art, processes for the chemical-mechanical polishing of borophosphosilicate glass (BPSG) material are known and described, for instance, in the following references.

US 2004/0029375 A1 discloses a process for the chemical-mechanical polishing of BPSG material using silica- or ceria-based slurries whose formulation are not further specified or using a silica-based slurry comprising an anionic surfactant such as ammonium polycarboxylate (APC).

US 2009/0081927 A1 discloses a CMP composition for polishing a substrate, for example BPSG, comprising (i) a liquid carrier, (ii) an abrasive suspended in the liquid carrier, wherein the abrasive comprises metal oxide particles having a surface which has been treated with a compound selected from the group consisting of an amino silane compound, a phosphononiumsi-lane compound, and a sulfonium silane compound, and (iii) an acid selected from the group consisting of a phosphonic acid and a boron containing acid.

US 2007/176141 A1 discloses an aqueous composition useful for polishing silica and boro-phosphate-silicate-glass on a semiconductor wafer comprising carboxylic acid polymer, abrasive, polyvinylpyrrolidone, cationic compound, zwitterionic compound and balance water, wherein the polyvinylpyrrolidone has an average molecular weight between 100 grams/mole to 1,000,000 grams/mole.

JP 2006/041033 A2 discloses a CMP technology for planarizing an interlayer insulating film, BPSG film, or insulating film for shallow-trench isolation. The CMP composition contains cerium oxide particles, dispersants, water soluble polymers, and water. The water soluble polymer is obtained by polymerization of a monomer containing an unsaturated carboxylic acid or its salt using an azo compound—either anionic or amphoteric—or its salt as polymerization initiator.

One of the objects of the present invention was to provide a CMP composition and a CMP process appropriate for the chemical-mechanical polishing of BPSG and showing an improved polishing performance, particularly a high material removal rate (MRR) of BPSG, or an appropriate selectivity of BPSG to silicon oxide (referred to as "BPSG:oxide selectivity" in the following) with regard to MRR of less than 1:1—for example a selectivity of BPSG to tetraethyl orthosilicate (TEOS) with regard to MRR in the range of from 0.5:1 to 1:1—, or the combination of high BPSG-MRR and an appropriate BPSG:oxide selectivity with regard to MRR of below 1:1. Furthermore, one of the objects of the present invention was to provide a CMP composition and a CMP process appropriate for the chemical-mechanical polishing of BPSG material as part of a substrate comprising silicon oxide—for example TEOS —, silicon nitride, and polysilicon. Moreover, a CMP process was sought that is easy to apply and requires as few steps as possible.

Accordingly, a process for the manufacture of semiconductor devices comprising the chemical mechanical polishing of borophosphosilicate glass (BPSG) material in the presence of a CMP composition comprising:

(A) inorganic particles, organic particles, or a mixture or composite thereof,
(B) at least one type of anionic phosphate or phosphonate as dispersing agent or charge reversal agent,
(C) at least one type of surfactant, and
(D) an aqueous medium.

was found. This CMP composition is referred to as (Q) or CMP composition (Q) in the following.

Moreover, the use of the CMP composition (Q) for chemical-mechanical polishing of a substrate comprising BPSG material was found.

Preferred embodiments are explained in the claims and the specification. It is understood that combinations of preferred embodiments are within the scope of the present invention.

A semiconductor device can be manufactured by the process of the invention, said process comprises the chemical mechanical polishing of BPSG material in the presence of the CMP composition (Q). Preferably, said process comprises the chemical mechanical polishing of BPSG and silicon oxide in the presence of (Q). More preferably, said process comprises the chemical mechanical polishing of BPSG and silicon oxide as part of a substrate comprising BPSG, silicon oxide, silicon nitride, and polysilicon in the presence of (Q). Most preferably, said process comprises the chemical mechanical polishing of BPSG and TEOS as part of a substrate comprising BPSG, TEOS, silicon nitride, and polysilicon in the presence of (Q). Generally, this BPSG can be of any type, form, or shape of BPSG. This BPSG preferably has the shape of a layer and/or overgrowth. If this BPSG the shape of a layer and/or overgrowth, the BPSG content is preferably more than 90%, more preferably more than 95%, most preferably more than 98%, particularly more than 99%, for example more than 99.9% by weight of this corresponding layer and/or overgrowth. Generally, this BPSG can be produced or obtained in different ways. For example, BPSG can be obtained in the ways as described in WO2003/008665 or in M. Kirchhoff, M. IIg, D. Cote, Application of borophosphosilicate glass (BPSG) in microelectronic processing, in: Berichte der Bunsengesellschaft für physikalische Chemie, Volume 100, Issue 9, pages 1434-1437, September 1996.

If the process of the invention comprises the chemical mechanical polishing of a substrate comprising BPSG and silicon dioxide, the selectivity of BPSG to silicon dioxide with regard to MRR is preferably less than 1:1, more preferably less than 0.98:1, most preferably less than 0.95:1, particularly less than 0.9:1, for example less than 0.85:1, and the selectivity of BPSG to silicon dioxide with regard to the MRR is preferably more than 0.1:1, more preferably higher than 0.25:1, most preferably higher than 0.4:1, particularly higher than 0.55:1, for example higher than 0.65:1. This selectivity can be adjusted for example by the type and concentration of the components (B) and/or (C) of the CMP composition (Q) and by setting other parameters such as the pH value.

The CMP composition (Q) is used for chemical-mechanical polishing of a substrate comprising BPSG material, preferably for chemical-mechanical polishing of a substrate comprising BPSG and silicon oxide, most preferably for chemical-mechanical polishing of BPSG and silicon oxide as part of a substrate comprising BPSG, silicon oxide, silicon nitride, and polysilicon, particularly for chemical mechanical polishing of BPSG and TEOS as part of a substrate comprising BPSG, TEOS, silicon nitride, and polysilicon.

If the CMP composition (Q) is used for polishing a substrate comprising BPSG and silicon dioxide, the selectivity of BPSG to silicon dioxide with regard to MRR is preferably less than 1:1, more preferably less than 0.98:1, most preferably less than 0.95:1, particularly less than 0.9:1, for example less than 0.85:1, and the selectivity of BPSG to silicon dioxide with regard to the MRR is preferably more than 0.1:1, more preferably higher than 0.25:1, most preferably higher than 0.4:1, particularly higher than 0.55:1, for example higher than 0.65:1.

The CMP composition (Q) comprises the components (A), (B), (C) and (D) as described below.

The CMP composition (Q) comprises inorganic particles, organic particles, or a mixture or composite thereof (A). (A) can be
- of one type of inorganic particles,
- a mixture or composite of different types of inorganic particles,
- of one type of organic particles,
- a mixture or composite of different types of organic particles, or
- a mixture or composite of one or more types of inorganic particles and one or more types of organic particles.

A composite is a composite particle comprising two or more types of particles in such a way that they are mechanically, chemically or in another way bound to each other. An example for a composite is a core-shell particle comprising one type of particle in the outer sphere (shell) and another type of particle in the inner sphere (core).

Generally, the particles (A) can be contained in varying amounts in the CMP composition (Q). Preferably, the amount of (A) is not more than 7 wt. % (wt. % stands for "percent by weight"), more preferably not more than 3 wt. %, most preferably not more than 1.5 wt. %, particularly not more than 0.7 wt. %, for example not more than 0.3 wt. %, based on the total weight of the composition (Q). Preferably, the amount of (A) is at least 0.002 wt. %, more preferably at least 0.01 wt. %, most preferably at least 0.05 wt. %, particularly at least 0.1 wt. %, for example at least 0.2 wt. %, based on the total weight of the composition (Q).

Generally, the particles (A) can be contained in varying particle size distributions. The particle size distributions of the particles (A) can be monomodal or multimodal. In case of multimodal particle size distributions, bimodal is often preferred. In order to have an easily reproducible property profile and easily reproducible conditions during the CMP process of the invention, a monomodal particle size distribution is preferred for (A). It is most preferred for (A) to have a monomodal particle size distribution.

The mean particle size of the particles (A) can vary within a wide range. The mean particle size is the $d_{50}$ value of the particle size distribution of (A) in the aqueous medium (D) and can be determined using dynamic light scattering techniques. Then, the $d_{50}$ values are calculated under the assumption that particles are essentially spherical. The width of the mean particle size distribution is the distance (given in units of the x-axis) between the two intersection points, where the particle size distribution curve crosses the 50% height of the relative particle counts, wherein the height of the maximal particle counts is standardized as 100% height.

Preferably, the mean particle size of the particles (A) is preferably not more than 1000 nm, more preferably not more than 500 nm, most preferably not more than 300 nm, particularly not more than 250 nm, for example not more than 220 nm, and the mean particle size of the particles (A) is preferably at least 5 nm, more preferably at least 20 nm, most preferably at least 40 nm, particularly at least 60 nm, for example at least 80 nm, as measured with dynamic light scattering techniques using instruments such as High Performance Particle Sizer (HPPS) from Malvern Instruments, Ltd. or Horiba LB550.

The particles (A) can be of various shapes. Thereby, the particles (A) may be of one or essentially only one type of shape. However, it is also possible that the particles (A) have different shapes. For instance, two types of differently shaped particles (A) may be present. For example, (A) can have the shape of cubes, cubes with chamfered edges, octahedrons, icosahedrons, nodules or spheres with or without protrusions or indentations. Preferably, they are spherical with no or only very few protrusions or indentations.

The chemical nature of particles (A) is not particularly limited. (A) may be of the same chemical nature or a mixture or composite of particles of different chemical nature. As a rule, particles (A) of the same chemical nature are preferred. Generally, (A) can be
- inorganic particles such as a metal, a metal oxide or carbide, including a metalloid, a metalloid oxide or carbide, or
- organic particles such as polymer particles,
- a mixture or composite of inorganic and organic particles.

Particles (A) are preferably inorganic particles. Among them, oxides and carbides of metals or metalloids are preferred. More preferably, particles (A) are alumina, ceria, copper oxide, iron oxide, nickel oxide, manganese oxide, silica, silicon nitride, silicon carbide, tin oxide, titania, titanium carbide, tungsten oxide, yttrium oxide, zirconia, or mixtures or composites thereof. Most preferably, particles (A) are alumina, ceria, silica, titania, zirconia, or mixtures or composites thereof. In particular, (A) are ceria particles. For example, (A) are colloidal ceria particles. Typically, colloidal ceria particles are produced by a wet precipitation process.

In another embodiment in which (A) are organic particles, or a mixture or composite of inorganic and organic particles, polymer particles are preferred as organic particles. Polymer particles can be homo- or copolymers. The latter may for example be block-copolymers, or statistical copolymers. The homo- or copolymers may have various structures, for instance linear, branched, comb-like, dendrimeric, entangled or cross-linked. The polymer particles may be obtained according to the anionic, cationic, controlled radical, free radical mechanism and by the process of suspension or emulsion polymerisation. Preferably, the polymer particles are at least one of the polystyrenes, polyesters, alkyd resins, polyurethanes, polylactones, polycarbonates, poylacry-lates, polymethacrylates, polyethers, poly(N-alkylacrylamide)s, poly(methyl vinyl ether)s, or copolymers comprising at least one of vinylaromatic compounds, acrylates, methacrylates, maleic anhydride acrylamides, methacrylamides, acrylic acid, or methacrylic acid as monomeric units, or mixtures or composites thereof. Among them, polymer particles with a cross-linked structure are preferred.

The CMP composition (Q) comprises at least one type of anionic phosphate or phosphonate as dispersing agent or charge reversal agent (B), preferably one to two types of (B), more preferably one type of (B). In general, a dispersing agent used in a CMP composition is a surface-active compound which is—if added to a suspension—capable of improving the separation of particles and preventing settling or clumping. In general, a charge reversal agent in a CMP composition is a compound capable of reversing the charge of abrasive particles present in the CMP composition.

The anionic phosphate or phosphonate as dispersing agent or charge reversal agent (B) can be contained in varying amounts in the CMP composition (Q). Preferably, the amount of (B) is not more than 4000 ppm ("ppm" stands for "parts per million"), more preferably not more than 1000 ppm, most preferably not more than 300 ppm, particularly not more than 150 ppm, for example not more than 80 ppm, based on the total weight of the composition (Q). Preferably, the amount of (B) is at least 0.1 ppm, more preferably at least 1 ppm, most preferably at least 3 ppm, particularly at least 6 ppm, for example at least 10 ppm, based on the total weight of the composition (Q).

The ratio of the weight percentage of particles (A) based on the total weight of the composition (Q) to the weight percentage of the phosphate or phosphonate as dispersing agent or charge reversal agent (B) based on the total weight of the composition (Q) can vary within a wide range. This ratio is referred to "(NB)-ratio" in the following. Preferably, the (NB)-ratio is not more than 2000:1, more preferably not more than 1000:1, most preferably not more than 600:1, particularly not more than 400:1, for example not more than 250:1. Preferably, the (NB)-ratio is at least 3:1, more preferably at least 15:1, most preferably at least 60:1, particularly at least 100:1, for example at least 150:1.

Preferably, (B) is selected from the group consisting of water-soluble condensed phosphates.

Examples for water-soluble condensed phosphates are salts, in particular ammonium, sodium and potassium salts, of metaphosphates of the general formula (I):

and polyphosphates of the general formula (II) and (III):

wherein M is ammonium, sodium and/or potassium and the index n is from 2 to 10,000. Regarding the polyphosphates of formulas (I), (II), and (III), the index n is preferably from 2 to 2,000, more preferably from 2 to 300, most preferably from 2 to 50, particularly from 2 to 15, for example from 3 to 8.

Examples for particularly suitable water-soluble condensed phosphates (B) are Graham's salt $(NaPO_3)_{40-50}$, Calgon™ $(NaPO_3)_{15-20}$, Kurrol's salt $(NaPO_3)$, with n=about 5000, and ammonium hexametaphosphate, sodium hexametaphosphate and potassium hexametaphosphate.

In another embodiment, polyvinyl phosphonate, and/or the deprotonated form of a copolymer comprising vinyl phosphonic acid and another monomer as monomeric units is preferred as (B). If polyvinyl phosphonate is used as (B), it is preferably a polyvinyl phosphonate as the deprotonated form of the polyvinylphosphonic acid according to below formula (IV), with n in formula (IV) being an integer of from 5 to 1000. If polyvinyl phosphonate, and/or the deprotonated form of a copolymer comprising vinyl phosphonic acid and another monomer as monomeric units is used as (B), the weight average molecular weight is preferably not more than 120000 Daltons, more preferably not more than 70000 Daltons, most preferably not more than 40000 Daltons, particularly not more than 20000 Daltons, for example not more than 13000 Daltons, and the weight average molecular weight is preferably at least 500 Daltons, more preferably at least 1500 Daltons, most preferably at least 4000 Daltons, particularly at least 7000 Daltons, for example at least 9000 Daltons, as determined by gel permeation chromatography (GPC). If the deprotonated form of a copolymer comprising vinyl phosphonic acid and another monomer as monomeric units is used as (B), this copolymer is preferably a copolymer comprising vinyl phosphonic acid and acrylic acid as monomeric units, and for example poly(vinylphosphonic acid-acrylic acid) copolymer obtained by copolymerization of unsubstituted vinyl phosphonic acid and unsubstituted acrylic acid.

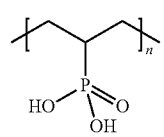

formula (IV)

The CMP composition (Q) comprises at least one type of surfactant (C), preferably one to two types of (C), more preferably one type of (C). In general, a surfactant used in a CMP composition is a surface-active compound which decreases the surface tension of a liquid, the interfacial tension between two liquids, or that between a liquid and a solid. The surfactant (C) is preferably a water-soluble polymer surfactant, more preferably a linear or branched alkylene oxide homopolymer or copolymer, most preferably a block copolymer containing ethylene oxide and propylene oxide monomer units, particularly ethylene-oxide/propylene-oxide copolymers of ethylene diamine, particularly preferably a surfactant such as "Tetronic® 304", "Tetronic® 904" or "Pluronic® PE 3500" provided by BASF, for example "Tetronic® 304" or "Tetronic® 904" provided by BASF.

If a block copolymer containing ethylene oxide and propylene oxide monomer units is used as surfactant (C), the weight average molecular weight is preferably not more than 200000 Daltons, more preferably not more than 70000 Daltons, most preferably not more than 20000 Daltons, particularly not more than 10000 Daltons, for example not more than 7000 Daltons, and the weight average molecular weight is preferably at least 500 Daltons, more preferably at least 1000 Daltons, most preferably at least 1300 Daltons, particularly at least 1600 Daltons, for example at least 1900 Daltons, as determined by gel permeation chromatography (GPC).

According to the invention, the CMP composition (Q) contains an aqueous medium (D). (D) can be of one type or a mixture of different types of aqueous media.

In general, the aqueous medium (D) can be any medium which contains water. Preferably, the aqueous medium (D) is a mixture of water and an organic solvent miscible with water (e.g. an alcohol, preferably a $C_1$ to $C_3$ alcohol, or an alkylene glycol derivative). More preferably, the aqueous medium (D) is water. Most preferably, aqueous medium (D) is de-ionized water.

If the amounts of the components other than (D) are in total y % by weight of the CMP composition, then the amount of (D) is (100−y) % by weight of the CMP composition.

The CMP composition (Q) can further optionally contain at least one biocide (E), for example one biocide. In general, the biocide is a compound which deters, renders harmless, or exerts a controlling effect on any harmful organism by chemical or biological means. Preferably, (E) is an quaternary ammonium compound, an isothiazolinone-based compound, an N-substituted diazenium dioxide, or an N-hydroxy-diazenium oxide salt. More preferably, (E) is an N-substituted diazenium dioxide, or an N-hydroxy-diazenium oxide salt If present, the biocide (E) can be contained in varying amounts. If present, the amount of (E) is preferably not more than 0.5 wt. %, more preferably not more than 0.1 wt. %, most preferably not more than 0.05 wt. %, particularly not more than 0.02 wt. %, for example not more than 0.008 wt. %, based on the total weight of the corresponding composition. If present, the amount of (E) is preferably at least 0.0001 wt. %, more preferably at least 0.0005 wt. %, most preferably at least 0.001 wt. %, particularly at least 0.003 wt. %, for example at least 0.006 wt. %, based on the total weight of the corresponding composition.

The properties of the CMP composition (Q) and of the process in the presence of (Q), such as stability and polishing performance, may depend on the pH of the corresponding composition. The pH value of the composition (Q) is preferably at least 4, more preferably at least 5, more preferably at least 5.5, particularly at least 6. The pH value of the composition (Q) is preferably not more than 10, more preferably not more than 9, more preferably not more than 8.5, particularly not more than 8.

The CMP composition (Q) can contain further optionally contain at least one pH adjusting agent (G). In general, the pH adjusting agent (G) is a compound which is added to the CMP composition (Q) to have its pH value adjusted to the required value. Preferably, the CMP composition (Q) contains at least one pH adjusting agent (G). Preferred pH adjusting agents are inorganic acids, carboxylic acids, amine bases, alkali hydroxides, ammonium hydroxides, including tetraalkylammonium hydroxides. For example, the pH adjusting agent (G) is nitric acid, sulfuric acid, ammonia, sodium hydroxide, or potassium hydroxide.

If present, the pH adjusting agent (G) can be contained in varying amounts. If present, the amount of (G) is preferably not more than 10 wt. %, more preferably not more than 2 wt. %, most preferably not more than 0.5 wt. %, particularly not more than 0.1 wt. %, for example not more than 0.05 wt. %, based on the total weight of the corresponding composition. If present, the amount of (G) is preferably at least 0.0005 wt. %, more preferably at least 0.005 wt. %, most preferably at least 0.025 wt. %, particularly at least 0.1 wt. %, for example at least 0.4 wt. %, based on the total weight of the corresponding composition.

The CMP composition (Q) may also contain, if necessary, various other additives, including but not limited to stabilizers, friction reducing agents, etc. Said other additives are for instance those commonly employed in CMP compositions and thus known to the person skilled in the art. Such addition can for example stabilize the dispersion, or improve the polishing performance, or the selectivity between different layers.

If present, said other additive can be contained in varying amounts. Preferably, the total amount of said other additives is not more than 10 wt. %, more preferably not more than 2 wt. %, most preferably not more than 0.5 wt. %, particularly not more than 0.1 wt. %, for example not more than 0.01 wt. %, based on the total weight of the corresponding CMP composition. Preferably, the total amount of said other additives is at least 0.0001 wt. %, more preferably at least 0.001 wt. %, most preferably at least 0.008 wt. %, particularly at least 0.05 wt. %, for example at least 0.3 wt. %, based on the total weight of the corresponding composition.

According to one preferred embodiment, a process for the manufacture of semiconductor devices comprising the chemical mechanical polishing of BPSG material was carried out in the presence of a CMP composition comprising
   (A) ceria particles,
   (B) water-soluble condensed phosphates selected from the group consisting of Graham's salt $(NaPO_3)_{40-50}$, Calgon™ $(NaPO_3)_{15-20}$, Kurrol's salt $(NaPO_3)_n$ with n=about 5000, and ammonium hexametaphosphate, sodium hexametaphosphate and potassium hexametaphosphate as dispersing agent or charge reversal agent,
   (C) at least one type of surfactant, and
   (D) an aqueous medium.

According to another preferred embodiment, a process for the manufacture of semiconductor devices comprising the chemical mechanical polishing of BPSG material was carried out in the presence of a CMP composition comprising
   (A) ceria particles,
   (B) at least one type of anionic phosphate or phosphonate as dispersing agent or charge reversal agent,
   (C) a water-soluble polymer surfactant which is a linear or branched alkylene oxide homopolymer or copolymer, and
   (D) an aqueous medium.

According to another preferred embodiment, a process for the manufacture of semiconductor devices comprising the chemical mechanical polishing of BPSG material was carried out in the presence of a CMP composition comprising
   (A) ceria particles,
   (B) a water-soluble condensed phosphate as dispersing agent or charge reversal agent,
   (C) a water-soluble polymer surfactant which is an ethylene-oxide/propylene-oxide copolymer of ethylene diamine, and
   (D) an aqueous medium.

According to another preferred embodiment, a process for the manufacture of semiconductor devices comprising the chemical mechanical polishing of BPSG material was carried out in the presence of a CMP composition comprising
   (A) ceria particles having a mean particle size of from 50 to 250 nm as determined by dynamic light scattering, in an amount of from 0.05 to 1.5 wt. % by weight of the CMP composition,
   (B) a water-soluble condensed phosphate as dispersing agent or charge reversal agent, in an amount of from 2 to 150 ppm by weight of the CMP composition,
   (C) a water-soluble polymer surfactant which is a linear or branched alkylene oxide homopolymer or copolymer, in an amount of from 50 to 5000 ppm by weight of the CMP composition, and
   (D) an aqueous medium.

According to another preferred embodiment, a process for the manufacture of semiconductor devices comprising the chemical mechanical polishing of BPSG material was carried out in the presence of a CMP composition comprising
   (A) ceria particles having a mean particle size of from 50 to 250 nm as determined by dynamic light scattering, in an amount of from 0.05 to 1.5 wt. % by weight of the CMP composition,
   (B) water-soluble condensed phosphates selected from the group consisting of Graham's salt $(NaPO_3)_{40-50}$, Calgon™ (NaPO$_3$)$_{15-20}$, Kurrol's salt (NaPO$_3$), with n=about 5000, and ammonium hexametaphosphate, sodium hexametaphosphate and potassium hexametaphosphate as dispersing agent or charge reversal agent, in an amount of from 2 to 150 ppm by weight of the CMP composition, (C) a water-soluble polymer surfactant which is a linear or branched alkylene oxide homopolymer or copolymer, in an amount of from 50 to 5000 ppm by weight of the CMP composition, and (D) an aqueous medium.

Processes for preparing CMP compositions are generally known. These processes may be applied to the preparation of the CMP composition (Q). This can be carried out by dispersing or dissolving the above-described components (A), (B), and (C) in the aqueous medium (D), preferably water, and optionally by adjusting the pH value through adding an acid, a base, a buffer or an pH adjusting agent. For this purpose the customary and standard mixing processes and mixing apparatuses such as agitated vessels, high shear impellers, ultrasonic mixers, homoge-nizer nozzles or counterflow mixers, can be used.

The CMP composition (Q) is preferably prepared by dispersing the particles (A), dispersing and/or dissolving the at least one type of anionic phosphate or phosphonate as dispersing agent or charge reversal agent (B), the at least one type of surfactant (C) and optionally other additives in the aqueous medium (D).

The polishing process is generally known and can be carried out with the processes and the equipment under the conditions customarily used for the CMP in the fabrication of wafers with integrated circuits. There is no restriction on the equipment with which the polishing process can be carried out.

As is known in the art, typical equipment for the CMP process consists of a rotating platen which is covered with a polishing pad. Also orbital polishers have been used. The wafer is mounted on a carrier or chuck. The side of the wafer being processed is facing the polishing pad (single side polishing process). A retaining ring secures the wafer in the horizontal position.

Below the carrier, the larger diameter platen is also generally horizontally positioned and pre-sents a surface parallel to that of the wafer to be polished. The polishing pad on the platen con-tacts the wafer surface during the planarization process.

To produce material loss, the wafer is pressed onto the polishing pad. Both the carrier and the platen are usually caused to rotate around their respective shafts extending perpendicular from the carrier and the platen. The rotating carrier shaft may remain fixed in position relative to the rotating platen or may oscillate horizontally relative to the platen. The direction of rotation of the carrier is typically, though not necessarily, the same as that of the platen. The speeds of rotation for the carrier and the platen are generally, though not necessarily, set at different values. During the CMP process of the invention, the CMP composition (Q) is usually applied onto the polishing pad as a continuous stream or in dropwise fashion. Customarily, the temperature of the platen is set at temperatures of from 10 to 70° C.

The load on the wafer can be applied by a flat plate made of steel for example, covered with a soft pad that is often called backing film. If more advanced equipment is being used a flexible membrane that is loaded with air or nitrogen pressure presses the wafer onto the pad. Such a membrane carrier is preferred for low down force processes when a hard polishing pad is used, because the down pressure distribution on the wafer is more uniform compared to that of a carrier with a hard platen design. Carriers with the option to control the pressure distribution on the wafer may also be used according to the invention. They are usually designed with a number of different chambers that can be loaded to a certain degree independently from each other.

For further details reference is made to WO 2004/063301 A1, in particular page 16, paragraph to page 18, paragraph [0040] in conjunction with the FIG. 2.

By way of the CMP process of the invention, wafers with integrated circuits comprising a dielec-tric layer can be obtained which have an excellent functionality.

The CMP composition (Q) can be used in the CMP process as ready-to-use slurry, they have a long shelf-life and show a stable particle size distribution over long time. Thus, they are easy to handle and to store. They show an excellent polishing performance, particularly pertaining to the MRR of BPSG, pertaining to an appropriate BPSG:oxide selectivity with regard to MRR of less than 1:1—for example a selectivity of BPSG to TEOS with regard to MRR in the range of from 0.5:1 to 1:1—, and pertaining to the combination of high BPSG-MRR and an appropriate BPSG:oxide selectivity regard to MRR of below 1:1. Since the amounts of its components are held down to a minimum, the CMP composition (Q) and the CMP process according to the invention can be used or applied in a cost-effective way.

EXAMPLES AND COMPARATIVE EXAMPLES

The pH value is measured with a pH electrode (Schott, blue line, pH 0-14/−5 . . . 100° C./3 mol/L sodium chloride).

Inorganic particles (A) used in the Examples

Ceria particles used as particles (A) are of colloidal type, having a mean particle size of from 100 to 200 nm as determined by dynamic light scattering using instruments such as High Performance Particle Sizer (HPPS) from Malvern Instruments, Ltd. or Horiba LB550. These ceria particles are referred to as ceria particles (A1) in the following.

General procedure for the CMP experiments

CMP process:

Polishing tool: AMAT Mirra capable to polish 200 mm wafers

Substrates polished: Multi-layer substrate comprising borophosphosilicate glass (BPSG) silicon oxide, tetraethoxysilane (TEOS) silicon oxide, LPCVD silicon nitride and amorphous polysilicon. This substrate is referred to as substrate (S1) in the following.

Flow rate: 160 ml/min
Polishing pad: IC1010-k groove pad
Conditioner: 3M A166; insitu conditioning at 5 lbs
Platen rpm: 93 rpm
Carrier rpm: 87 rpm
Down force: 2.0, 2.5 and 3.0 psi
Polishing time: 60 seconds Film thickness of substrates being polished was measured before and after CMP using Ther-mawave Optiprobe 2600. In this way, the material removal rates were determined.

Standard procedure for slurry preparation:

For the preparation of the aqueous polishing compositions Q1 to Q7, ceria particles (A1), sodium hexametaphosphate (weight ratio of ceria to sodium hexametaphosphate=200:1) were dispersed or dissolved in ultrapure water. Sodium hexametaphosphate is used as the dispersing agent. Surfactants are added into above mixture with 1 wt. % stock solution.

TABLE 1

CMP compositions Q1 to Q7
CMP compositions of the examples Q1 to Q7 and their pH properties are shown in table 1, wherein the aqueous medium (D) of the CMP compositions is de-ionized water. The amounts of the components (A), (B), (C) are specified in weight percent (wt. %) or parts per million (ppm) by weight of the corresponding CMP composition. If the amounts of the components other than (D) are in total y % by weight of the CMP composition, then the amount of (D) is (100 − y) % by weight of the CMP composition.

| Composition No. | Ceria (A1) | Sodium hexametaphosphate | Surfactant | pH |
|---|---|---|---|---|
| Q1 | 0.25 wt. % | 12.5 ppm | None | natural |
| Q2 | 0.25 wt. % | 12.5 ppm | 500 ppm PEG10k[a] | natural |
| Q3 | 0.25 wt. % | 12.5 ppm | 500 ppm Pluronic ® PE 3500[b] | natural |
| Q4 | 0.25 wt. % | 12.5 ppm | 500 ppm Tetronic ® 304[c] | natural |
| Q5 | 0.25 wt. % | 12.5 ppm | 1000 ppm Tetronic ® 304[c] | natural |
| Q6 | 0.25 wt. % | 12.5 ppm | 1500 ppm Tetronic ® 304[c] | natural |
| Q7 | 0.25 wt. % | 12.5 ppm | 500 ppm Tetronic ® 904[d] | natural |

[a] PEG10k is polyethylene glycol with a weight average molecular weight of 10,000 Dalton as determined by gel permeation chromatography (GPC).
[b] Pluronic ® PE 3500 (provided by BASF) is a low-foaming, nonionic surfactant and is a block copolymer in which the central polypropylene glycol group is flanked by two polyethylene glycol groups. The weight average molecular weight of Pluronic ® PE 3500 is 1900 Dalton as determined by gel permeation chromatography (GPC).
[c] Tetronic ® 304 (provided by BASF) is a nonionic surfactant and is an ethylene-oxide/propylene-oxide copolymer of ethylene diamine terminating in primary hydroxyl groups. The weight average molecular weight of Tetronic ® 304 is 1650 Dalton as determined by gel permeation chromatography (GPC).
[d] Tetronic ® 904 (provided by BASF) is a nonionic surfactant and is an ethylene-oxide/propylene-oxide copolymer of ethylene diamine terminating in primary hydroxyl groups. The weight average molecular weight of Tetronic ® 904 is 6700 Dalton as determined by gel permeation chromatography (GPC).

TABLE 2

Polishing Performance of the CMP compositions Q1 to Q7
Table 2 shows BPSG/TEOS selectivity data in the process of chemical-mechanical polishing of substrate (S1) using the CMP compositions Q1 to Q7. In the examples 5, 6 and 8 to 15, BPSG/TEOS selectivities of lower than 1 were obtained.

| Example No. | Composition No. | Downforce (psi) | BPSG MRR (Å/min) | TEOS MRR (Å/min) | SiN MRR (Å/min) | PolySi MRR (Å/min) | BPSG/TEOS Selectivity |
|---|---|---|---|---|---|---|---|
| Comparative Example C1 | Q1 | 2.0 | 1559 | 1200 | 197 | 189 | 1.30 |
| Example 1 | Q2 | 2.0 | 1240 | 1171 | 227 | 9 | 1.06 |
| Example 2 | Q2 | 2.5 | 1739 | 1470 | 289 | 3 | 1.18 |
| Example 3 | Q3 | 2.0 | 1523 | 1397 | 286 | 24 | 1.09 |
| Example 4 | Q3 | 2.5 | 1609 | 1419 | 270 | 27 | 1.13 |
| Example 5 | Q4 | 2.0 | 1305 | 1396 | 259 | 12 | 0.93 |
| Example 6 | Q4 | 2.5 | 1894 | 1914 | 297 | 10 | 0.99 |
| Example 7 | Q4 | 3.0 | 2252 | 2199 | 360 | 13 | 1.02 |
| Example 8 | Q5 | 2.0 | 1015 | 1094 | 220 | — | 0.93 |
| Example 9 | Q5 | 2.5 | 1297 | 1415 | 309 | — | 0.92 |
| Example 10 | Q5 | 3.0 | 1116 | 1579 | 352 | — | 0.71 |
| Example 11 | Q6 | 2.0 | 828 | 1006 | 189 | — | 0.82 |
| Example 12 | Q6 | 2.5 | 913 | 1253 | 251 | — | 0.73 |
| Example 13 | Q6 | 3.0 | 1017 | 1223 | 269 | — | 0.83 |
| Example 14 | Q7 | 2.0 | 1388 | 1416 | 249 | 8 | 0.98 |
| Example 15 | Q7 | 2.5 | 1710 | 2175 | 315 | 5 | 0.79 |

The CMP processes of the invention using these examples of CMP compositions show an improved polishing performance.

The invention claimed is:

1. A process for manufacturing a semiconductor device comprising:
chemical mechanical polishing a substrate comprising borophosphosilicate glass material and a silicon oxide with a chemical mechanical polishing (CMP) composition comprising:
inorganic particles, organic particles, a mixture thereof, or a composite thereof;
at least one of an anionic phosphate and a phosphonate as a dispersing agent or a charge reversal agent;
at least one surfactant; and
an aqueous medium,
wherein a selectivity of borophosphosilicate glass to silicon oxide is 1:1 or less.

2. The process according to claim 1, wherein the particles are inorganic particles.

3. The process according to claim 2, wherein the particles are ceria particles.

4. The process according to claim 1, wherein the particles have a mean particle size of from 50 to 250 nm as determined by dynamic light scattering.

5. The process according to claim 1, wherein the anionic phosphate or phosphonate is a water-soluble condensed phosphate.

6. The process according to claim 5, wherein the water-soluble condensed phosphate is a metaphosphate of general formula (I):

$$[M+_n(PO_3)_n] \quad (I);$$

a polyphosphate of general formula (II):

$$M{+}_nP_nO_{3n+1} \quad (II);$$ or a polyphosphate of general formula (III):

$$M{+}H_2P_nO_{3n+1} \quad (III);$$

wherein M is ammonium, sodium and/or potassium and n is from 2 to 10,000.

7. The process according to claim 1, wherein the anionic phosphate or phosphonate is a polyvinyl phosphonate, and/or a deprotonated form of a copolymer comprising vinyl phosphonic acid and another monomer as monomeric units.

8. The process according to claim 7, wherein the anionic phosphate or phosphonate is polyvinyl phosphonate having a weight average molecular weight from 1,000 to 70,000 Daltons as determined by gel permeation chromatography.

9. The process according to claim 1, wherein the surfactant is a water-soluble polymer surfactant.

10. The process according to claim 9, wherein the water-soluble polymer surfactant is a linear or branched alkylene oxide homopolymer or a linear or branched alkylene oxide copolymer.

11. The process according to claim 10, wherein said water-soluble polymer surfactant is a linear or branched alkylene oxide copolymer which is a block copolymer comprising ethylene oxide and propylene oxide monomer units.

12. The process according to claim 1, wherein a pH value of the CMP composition is of from 4 to 10.

13. The process according to claim 1, wherein the CMP composition comprises:
ceria particles having a mean particle size of from 50 to 250 nm as determined by dynamic light scattering, in an amount of from 0.05 to 1.5 wt. % by weight of the CMP composition;
a water-soluble condensed phosphate as a dispersing agent or a charge reversal agent, in an amount of from 2 to 150 ppm by weight of the CMP composition;
a water-soluble polymer surfactant which is a linear or branched alkylene oxide homopolymer or a linear or branched alkylene oxide copolymer, in an amount of from 50 to 5000 ppm by weight of the CMP composition; and
an aqueous medium.

14. The process according to claim 1,
wherein a selectivity of BPSG to silicon oxide is from 0.5:1 to 1:1.

15. The process according to claim 1, wherein said silicon oxide is tetraethyl orthosilicate.

16. A process for chemical-mechanical polishing a substrate comprising borophosphosilicate glass material and a silicon oxide:
chemical-mechanical polishing the substrate with a chemical mechanical polishing (CMP) solution comprising:
inorganic particles, organic particles, a mixture thereof, or a composite thereof;
at least one of an anionic phosphate and a phosphonate as a dispersing agent or a charge reversal agent;
at least one surfactant; and
an aqueous medium,
wherein a selectivity of borophosphosilicate glass to silicon oxide is 1:1 or less.

17. The process according to claim 16, wherein said silicon oxide is tetraethyl orthosilicate.

* * * * *